(12) United States Patent
Hellenthal et al.

(10) Patent No.: US 10,707,473 B2
(45) Date of Patent: Jul. 7, 2020

(54) BATTERY CELL FOR A BATTERY OF A MOTOR VEHICLE, BATTERY, MOTOR VEHICLE, AND METHOD FOR OPERATING A BATTERY CELL

(71) Applicant: AUDI AG, Ingolstadt (DE)

(72) Inventors: Berthold Hellenthal, Schwanstetten (DE); Michael Hinterberger, Großmehring (DE)

(73) Assignee: AUDI AG, Ingolstadt (DE)

( * ) Notice: Subject to any disclaimer, the term of this patent is extended or adjusted under 35 U.S.C. 154(b) by 170 days.

(21) Appl. No.: 15/549,692

(22) PCT Filed: Feb. 16, 2016

(86) PCT No.: PCT/EP2016/053207
§ 371 (c)(1),
(2) Date: Aug. 9, 2017

(87) PCT Pub. No.: WO2016/131792
PCT Pub. Date: Aug. 25, 2016

(65) Prior Publication Data
US 2018/0026255 A1 Jan. 25, 2018

(30) Foreign Application Priority Data
Feb. 18, 2015 (DE) .................. 10 2015 002 077

(51) Int. Cl.
*H01M 2/34* (2006.01)
*H01M 10/42* (2006.01)
(Continued)

(52) U.S. Cl.
CPC ............ *H01M 2/34* (2013.01); *B60L 50/64* (2019.02); *H01M 2/1077* (2013.01);
(Continued)

(58) Field of Classification Search
None
See application file for complete search history.

(56) References Cited

U.S. PATENT DOCUMENTS 9,536,197 B1 * 1/2017 Penilla .................. B60L 58/12
2006/0152190 A1 7/2006 Riemschneider
(Continued)

FOREIGN PATENT DOCUMENTS

CN 202363543 U 8/2012
CN 103891089 A 6/2014
(Continued)

OTHER PUBLICATIONS

Korean Office Action dated Oct. 12, 2018, in connection with corresponding KR Application No. 10-2017-7026156 (14 pgs., including machine-generated English translation).
(Continued)

*Primary Examiner* — Scott J. Chmielecki
(74) *Attorney, Agent, or Firm* — Maier & Maier, PLLC (57) ABSTRACT

A battery cell for a battery of a motor vehicle with a battery cell housing, in which a galvanic element is accommodated. The battery cell can be electrically connected to at least one other battery cell by way of two electrical connection terminals. A control device of the battery cell is operatively connected to at least one functional unit of the battery cell. The control device of the battery cell is designed for the purpose of receiving a command issued by an external control device. The control device includes a verification unit, which is designed for the purpose of verifying an authorization of the external control device to issue the command.

7 Claims, 2 Drawing Sheets

(51) Int. Cl.
  *H01M 10/48* (2006.01)
  *H02J 7/00* (2006.01)
  *B60L 50/64* (2019.01)
  *H01M 2/10* (2006.01)
  *G01R 31/378* (2019.01)

(52) U.S. Cl.
  CPC ..... *H01M 10/425* (2013.01); *H01M 10/4257* (2013.01); *H01M 10/48* (2013.01); *H01M 10/486* (2013.01); *H02J 7/00* (2013.01); *H02J 7/0029* (2013.01); *H02J 7/00036* (2020.01); *G01R 31/378* (2019.01); *H01M 2/345* (2013.01); *H01M 2/348* (2013.01); *H01M 2010/4271* (2013.01); *H01M 2010/4278* (2013.01); *H01M 2200/00* (2013.01); *H01M 2220/20* (2013.01); *H02J 7/00045* (2020.01); *H04Q 2209/40* (2013.01)

(56) References Cited

U.S. PATENT DOCUMENTS

| | | | | |
|---|---|---|---|---|
| 2007/0192877 | A1* | 8/2007 | Yoo | H01M 10/425 726/34 |
| 2013/0026973 | A1 | 1/2013 | Luke et al. | |
| 2013/0249317 | A1 | 9/2013 | Kang et al. | |
| 2014/0045036 | A1* | 2/2014 | Schaefer | H01M 2/34 429/156 |
| 2014/0123310 | A1* | 5/2014 | Cherry | G06F 21/602 726/27 |
| 2015/0042283 | A1* | 2/2015 | Camp | H02J 7/0019 320/121 |
| 2016/0218401 | A1* | 7/2016 | Hermann | H01M 2/305 |
| 2016/0232736 | A1* | 8/2016 | Holtappels | H01M 10/4257 |
| 2016/0233556 | A1* | 8/2016 | Nakamura | H02J 50/12 |
| 2016/0336572 | A1* | 11/2016 | Yoshida | B60L 53/56 |
| 2017/0229902 | A1* | 8/2017 | Kamikawa | H02J 7/0014 |

FOREIGN PATENT DOCUMENTS

| | | | |
|---|---|---|---|
| DE | 102010045037 A1 | 3/2011 | |
| DE | 102012014471 A1 | 1/2013 | |
| DE | 112010003272 T5 | 1/2013 | |
| DE | 102012223482 A1 | 6/2014 | |
| EP | 2355066 A2 | 8/2011 | |
| JP | 2006-506787 A | 2/2006 | |
| JP | 2014-529117 A | 10/2014 | |
| KR | 10-2012-0075398 A | 7/2012 | |
| WO | 2013/016548 A2 | 1/2013 | |
| WO | WO-2013016548 A2 * | 1/2013 | ............. B60L 58/12 |

OTHER PUBLICATIONS

Office Action dated Mar. 21, 2019 in corresponding Korean Application No. 10-2017-7026156 ; 8 pages.

International Search Report dated May 3, 2016 of corresponding International application No. PCT/EP2016/053207; 12 pgs.

Notification of Transmittal of the Translation of the International Preliminary Report on Patentability dated Aug. 31, 2017, in connection with corresponding international application No. PCT/EP2016/053207 (6 pgs).

Chinese Office Action dated Aug. 22, 2019, in connection with corresponding CN Application No. 201680011820.8 (14 pgs., including machine-generated English translation).

\* cited by examiner

BATTERY CELL FOR A BATTERY OF A MOTOR VEHICLE, BATTERY, MOTOR VEHICLE, AND METHOD FOR OPERATING A BATTERY CELL

FIELD

The invention relates to a battery cell for a battery of a motor vehicle. The battery cell comprises a battery cell housing, in which a galvanic element is accommodated. The battery cell can be electrically connected to at least one other battery cell of the battery via two electrical connection terminals. A control device of the battery cell is operatively connected to at least one functional unit of the battery cell. Beyond this, the invention relates to a battery with a plurality of such battery cells, a motor vehicle having a battery, and a method for operating a battery cell.

BACKGROUND

It is known from the prior art, for instance DE 10 2010 045 037 A1, to interconnect a plurality of battery cells to form a battery for supplying a specific voltage or a specific current. Such batteries are employed at the present time, in particular, as traction batteries in motor vehicles, such as, for instance, electric vehicles or hybrid vehicles, for supplying electrical drive energy.

DE 11 2010 003 272 T5 describes a battery cell with sensor elements integrated into the battery cell. The sensor elements are designed for measuring parameters of the battery cell, such as a temperature, a pressure, electrical parameters, as well as electrochemical properties of the battery cell. The sensor elements can be coupled to a communications device, which transmits data and information to a data processing device arranged outside of the battery cell. However, the battery cell itself can also be furnished with a device for saving, for transmitting, for receiving, and for processing data.

SUMMARY OF THE DISCLOSURE

The object of the present invention is to create an improved battery cell of the type object in the beginning, a battery having a plurality of such battery cells, a motor vehicle having such a battery, and a method for operating such a battery cell.

The battery cell according to the invention for a battery of a motor vehicle comprises a battery cell housing, in which a galvanic element is accommodated. The galvanic element is preferably designed as a secondary element, which can be discharged for supplying an electrical component and, after the discharging, can be recharged. In a way that is known as such, the galvanic element hereby comprises arresters in the form of metal foils, for instance, which are coated with the electrochemically active material of the electrodes of the galvanic element. Further provided is an electrolyte as well as a separator, which isolates the electrochemically active materials from one another. In such a galvanic element, the arresters can be stacked, folded, or coiled, so that the galvanic element may also be referred to as a cell stack or cell coil.

The battery cell can be electrically connected to at least one other battery cell of the battery via the electrical connection terminals of the battery cell. A control device of the battery cell is connected operatively to at least one functional unit of the battery cell. The control device can hereby actuate, in particular, the at least one functional unit and/or receive measurement values transmitted from the at least one functional unit and/or transmit data to the at least one functional unit.

The control device of the battery cell is designed for the purpose of receiving a command issued by an external control device. The command can prompt the control device to interact with the at least one functional unit. The control device hereby comprises a checking or verification unit, which is designed for the purpose of verifying an authorization of the external control device to issue the command. In this way, it can be ensured that only an authorized external control device can access the control device of the battery cell in such a way that, in consequence thereof, the control device of the battery cell interacts with the at least one functional unit. In this way, a secure access to the control device of the battery cell is ensured and any unpermitted manipulation of the battery cell furnished with the control device is prevented. As a result, an improved battery cell is created.

The provision of the control device imparts an intelligence to the battery cell; that is, the battery cell is designed as a so-called "SmartCell" (intelligent battery cell). The control device can be a local computing device in the form, for instance, of a microcontroller, an application-specific integrated circuit (ASIC), or a field programmable gate array (FPGA).

The external control device can be the control device of another battery cell of the battery. Preferably, however, the external control device is designed as an overriding control device, which is capable of issuing commands to a plurality of battery cells of the battery.

In an advantageous embodiment, the at least one functional unit of the battery cell comprises a switching element, which is designed for making and breaking an electrically conductive connection between an arrester of the galvanic element and at least one of the electrical connection terminals. The control device of the battery cell is hereby designed for the purpose of altering a switching state of the switching element at the command of the external control device.

This makes it possible to switch at least one of the electrical connection terminals—and when two switching elements are provided, both electrical connection terminals of the battery cell—in a voltage-free manner. In this way, it is possible to ensure that an electric voltage is present at the electrical connection terminals of the battery cell only when this is desired. This makes possible an especially safe operation and handling of the battery cell. Namely, a battery cell whose electrical connection terminals are switched in a voltage-free manner can be handled safely. In addition, when a defect in the battery cell occurs, it is possible to sever the electrically conductive connection between the arrester and at least one of the electrical connection terminals. As a result, danger can no longer arise from this battery cell.

By opening the switching element and thereby interrupting the electrically conductive connection between the arrester and the connection terminal, the battery cell is virtually isolated from the network.

In this way, it is possible, in particular, when a battery that comprises a plurality of battery cells and correspondingly can supply a high voltage is assembled, to ensure protection from high voltage. The battery namely can be, in particular, a high-voltage battery, that is, a battery that has a voltage of more than 60 volts. In particular, the high-voltage battery can be designed for the purpose of supplying voltages such as those employed in traction batteries of motor vehicles, that is, voltages in the range of several hundred volts. By interrupting the electrically conductive connection, it is also possible in a transport state, that is, for example, when the battery is being transported to its site of operation, to ensure that no dangers associated with a high voltage can arise from the battery.

The switching element, by means of which the electrically conductive connection between the arrester and the at least one connection terminal of the battery cell can be interrupted, may also be referred to as a current interrupt device (CID). What is involved in the present embodiment is preferably an electronic current interrupt device that is switched by the control device or computing device of the battery cell. For this purpose, the switching element can be designed, in particular, as a semiconductor component, to which a control voltage is applied by the control device of the battery cell for specifying the respective switching state. This makes it possible, in particular in the case of a targeted interruption of the electrically conductive connection, to take into account a plurality of parameters, for instance by establishing switching criteria in the control device of the battery cell.

Furthermore, the switching element can be closed on command, so that the electrically conductive connection is made. The voltage of the galvanic element is then applied at the connection terminals of the battery cell. However, only the authorized external control device is capable of actually allowing the switching element to be actuated by means of the control device internal to the battery cell, that is, is capable of allowing the switching state to be changed as desired. This makes the switching of the switching element especially secure.

For altering the switching state of the switching element, that is, for operating this isolating switch, different commands can be provided. Thus, a first command can bring about the closing of the isolating switch, that is, bringing the switching element into the switching state in which the electrically conductive connection between the arrester and the galvanic element is made. A further command can bring about the opening of the isolating switch, that is, the interruption of the electrically conductive connection.

The commands for operating the switching element are preferably encrypted and, when a plurality of battery cells are provided in the battery, a separate key can be provided for each battery cell. In order to provide an especially secure key, the respective key can have a length of at least 24 bits, for example.

Keys for decrypting respective commands can be stored in a one-time programmable (OTP) memory of the battery cell. The encrypted commands can be read out from such a memory by the external control device that has been verified as authorized, so that the switching element can be operated by the external control device through issuing of the command to the control device of the battery cell. Nonetheless, the operation itself hereby remains encrypted and thus especially secure.

An especially great degree of security can be achieved, furthermore, in that the command for closing the switching element differs relatively greatly from the command for opening the switching element. An inadvertent flipping of merely one bit, for example, then cannot result in an incorrect command, that is, a command that is not desired at all, from being executed.

It has been shown to be further advantageous when the control device of the battery cell is designed for the purpose of keeping a closed switching state of the switching element that depends on a new receipt of a command. Such a command may also be referred to as a keep-alive command, that is, as a command for "keeping alive," because, otherwise, the switching element opens and the battery cell does not supply voltage any longer to the connection terminals. Through the implementation of such a keep-alive command, a continuous, controlled function of the battery cell or a "keep on network" of the battery cell is ensured.

Nonetheless, an automatic opening of the switching element, that is, an interruption of the electrically conductive connection, occurs when the keep-alive command is not received. Thus, it can be ensured, in particular, that, after a sufficiently long inactivity of the external control device, the battery cell is switched off. If the battery cell is connected in series to further battery cells of the battery, this leads, at the same time, to a volt-free switching of the entire battery. Thus, during a long resting operation, a high security is ensured overall in regard to the voltage supplied by the battery cell or by the battery. In this case, too, the keep-alive command is preferably encrypted and dissimilar to the further commands for the operation of the switching element in regard to the bit sequence.

It can be provided that the command to keep the closed switching state of the switching element must be received by the control device of the battery cell after elapse of a predetermined period of time (for instance, a period of time of several seconds) and/or after a predetermined energy flow out of the battery cell or into the battery cell in order that the electrically conductive connection between the arrester and the terminal is interrupted. It can also be provided that the switching element opens when, after elapse of this period of time or after the predetermined value of the energy flow has been attained, a further period of time is allowed to elapse and/or a further energy flow into the battery cell or out of the battery cell is allowed to occur. This makes the implementation of the keep-alive command especially secure in terms of function. The energy flow can, in particular, be determined in watt seconds.

It has been shown to be further advantageous when the at least one functional unit of the battery cell comprises a switching element, which is arranged in a conduction line that connects the arresters of the galvanic element with one another. A resistor element is arranged in the conduction line in this case. The control device of the battery cell is designed for the purpose of closing the switching element on command. The closing of this switching element, arranged in the conduction line, thus ensures that the arresters of the galvanic element are connected to one another in an electrically conductive manner, with the current flowing via the resistor element. This leads to an active local discharging of the battery cell.

Thus, if desired, it can be ensured not only that no voltage is applied any longer at the electrical connection terminals of the battery cell, but that, moreover, it is possible to reduce deliberately even the voltage supplied by the galvanic element. Although this does not occur as abruptly as the volt-free switching of the terminals of the battery cell, it is still possible to achieve an especially great degree of security in handling of the battery cell.

This applies, in particular, when, through closing of the switching element arranged in the conduction line, the battery cell undergoes complete discharging, that is, when it is discharged in such a way that a later charging of the battery cell is rendered impossible. By way of such an active complete discharging, a later charging by parasitic or chemical effects is also prevented. In this way, after conclusion of the discharging time, switched-off battery cells can be delivered safely for disposal or to a recycling process in which the battery cells can be taken apart into their components, for example.

The command for discharging the battery cell, that is, for closing the switching element arranged in the conduction line, is also preferably encrypted and sufficiently dissimilar to the other commands for operating the switching element. For example, more than 10% of the bits, in particular more than 25% of the bits, can be different in order to ensure a sufficient dissimilarity of the command.

Furthermore, it can be provided that, through a command that brings about the closing of the switching element arranged in the conduction line, a closing of the switching element for which, in the opened switching state, there is an interruption of the electrically conductive connection between the arrester and the electrical connection terminal is, at the same time, rendered impossible. Then, during the (complete) discharging of the battery cell, no voltage can be applied at the electrical terminals of the battery cell. Making the closing of this switching element impossible can be provided, in particular, during active local discharging, which renders the battery cell unusable in regard to a later charging process. This can be achieved, in particular, by programming a corresponding sequence in a one-time programmable memory of the battery cell.

The control device of the battery cell is preferably designed for the purpose of opening the switching element, arranged between the arrester and the at least one electrical connection terminal, when at least one special command is received. This special command can be a type of emergency message that leads to interruption of the electrically conductive connection between the arrester and the terminal of the battery cell. It is possible in this way to ensure a secure voltage-free switching of the battery cell. This is of advantage, for instance, when the battery cell is arranged in a battery of a motor vehicle and, following an accident of the motor vehicle, emergency responders want to switch the battery in a volt-free manner. Such a special command in the form of an emergency message can, for example, have a length of at least 1,024 bits, so that the command is especially secure. However, the utility of the special command or of the emergency message to which each battery cell responds is appropriate not only in the case of accidents of a motor vehicle equipped with the battery. When the battery cell or the battery is switched into a transport mode, it is possible to achieve a great degree of security without any complicated communication.

When the battery cell has the switching element arranged in the conduction line, the control device of the battery cell is preferably designed for the purpose of closing the switching element arranged in the conduction line when at least one predetermined special command is received. This serves for increasing safety during handling of the battery cell or the battery, because the battery cell can be finally discharged by closing the switching element arranged in the conduction line. It is therefore possible to bring about a final storage mode of the battery cell, in which the battery cell can no longer be employed for taking up or delivering electric energy. A corresponding special command, which renders the battery cell unusable, can preferably have a length of at least 2,048 bits in order to ensure an especially great degree of security.

It has proven further advantageous when the at least one functional unit of the battery cell comprises a memory for saving data values, with the data values giving parameters that can be recorded by means of at least one sensor device of the battery cell. In this case, the control device of the battery cell is designed for the purpose of accessing the memory on command. Through the recording of the parameters, it is possible to collect information on the history of the battery cell and to document it for an analysis. In the present case, however, it can ensured that solely the control device of the battery cell is permitted to access the memory and not the external sensor device directly. In this way, it can be ensured that not all data values relating to the battery cell are freely accessible. In other words, it can be decided whether data values are to be freely accessible and for which data values the authorization of the external control device for querying the data values is to be verified initially. As a result of this, the recording of the history of the battery cell is especially secure and a value preservation of the battery cell can be ensured. It is possible, namely, to document the life of the battery cell without any gaps and in a tamper-free manner.

When the actual access to the memory occurs only via the local control device of the battery cell, any destruction of the control device of the battery cell makes it no longer possible to read out the stored data. In this way, it can be ensured that the memory of the battery cell functions only together with the control device that is provided for the battery cell. If, during access to the memory, an encryption is additionally utilized, then exclusively the control device or the microcontroller that possesses the correct key can access the memory, for instance in its local, in particular one-time programmable, memory.

The memory for the data values can be, in particular, a local, nonvolatile memory in the form of, for instance, a flash memory, an electrically erasable programmable read-only memory (EEPROM), a ferroelectric random access memory (FeRAM), or a magnetoresistive random access memory (MRAM). Such a nonvolatile memory can be located in the control device or be externally connected to said control device.

For reading, adding, saving, or overwriting data, it is possible to provide respectively encrypted commands, with it being possible, for example, to store the key in the control device. The key in the control device of the battery cell can therefore be used for encrypting the data in the nonvolatile memory. In this way, it can be ensured that, for example, the reading and writing of data in the nonvolatile memory is possible exclusively via the local control device. This ensures an especially great degree of security for the data present in the memory of the battery cell.

It has proven further advantageous when at least one key is provided, by means of which information transmitted to the external control device is encrypted. At least a portion of or the entire communication is hereby encrypted, for instance by an AES-128 encryption. Additionally or alternatively to such a symmetric encryption, it is also possible to employ asymmetric encryption methods, in which, in particular, a plurality of private and public keys are deposited in the battery cell.

For example, the at least one private key can be located in a one-time programmable memory (OTP memory) of the battery cell, so that the private key is accessible from the outside only with substantial difficulty. The at least one public key, in contrast, can be stored both in a nonvolatile memory of the battery cell and, in addition, in the OTP memory. The public key can hereby be read out by any external control device that is authorized to communicate at all with the control device of the battery cell. Through the use of such a key, it can be ensured that the information transmitted to the external control device by the battery cell cannot be intercepted and read or copied. This provides for an especially secure transmission of information.

At least one key can also be employed for the encryption of data to be stored in a memory of the battery. Then, even in the case of an undesired access to the memory containing the data, it is not possible to do anything with the captured data.

Preferably, furthermore, at least one key is provided by means of which the commands issued by the external control device can be decrypted. In this case, too, it is possible to employ a private key, in particular, because no effort needs then be made to keep secret the key employed for encryption of the command. Such private keys therefore make possible the encrypted communication during access to the different functional units of the battery cell. A private key can be provided in this case for all functional units. Alternatively, a respective private key can be provided for each of the functions.

When a plurality of keys are used, it can be provided that, during transmission of a respective message, the control device of the battery cell of the external control device communicates which (in particular private) key is to be employed for encryption of the next, that is, successive, message. Accordingly, even in the case of an identical content of the message, the bit sequence of the respective message is different in each case. This, too, makes difficult any eavesdropping of the communication between the control device of the battery cell and the external control device.

Furthermore, a stacked security hierarchy can be provided. To this end, the monitoring unit can be designed for the purpose of carrying out an access control in which the preceding execution of a first, hierarchically overriding command is the prerequisite for the execution of a second, hierarchically subordinate command. The access to the next highest level in each case is accordingly the prerequisite for unlocking the next lower level. A direct access to functions that are located on the lowest level is accordingly possible only after release of all functions on higher levels. It is also possible in this way to ensure an especially great degree of security in handling the data of the battery cell and in executing the commands relating to the functional units of the battery cell.

Functions of this kind, in particular functions secured in several steps, can, for example, be provided for different privacy levels for the reading of data, the addition of data, and the storage or overwriting of data. It is also possible, in particular, to make the operation of the switching element independent of whether a function with less critical content was permitted beforehand, such as, for instance, the read-out of data.

It is of further advantage when the battery cell has an identification that can be read out by the external control device. What is involved in this case can be, in particular, an identification number, such as, for example, a digital public identification number. Such an identification number can have a length of at least 16 bits and, in particular, of at least 64 bits, so that, even for a battery with a plurality of battery cells, each battery cell can be unequivocally identified. This identification number can, in particular, be read out by any external control device that is authorized to communicate at all with the control device of the battery cell.

When the external control device has read out this identification (in particular, the identification number), it is possible to release the access to information for the external control device relating, for example, to the switching state of the switching element and/or the voltage of the battery cell and/or the current strength during charging and/or discharging of the battery cell and/or a temperature of the battery cell and/or a pressure in the interior of the battery cell housing. Quantities such as the temperature and the pressure can hereby be recorded by corresponding sensor devices of the battery cell, while, in particular the switching state of the switching element, the voltage, and the current strength can also be recorded directly by the control device of the battery cell.

The commands for the read-out of one part or several parts of the aforementioned information can be publically accessible. However, it can also be provided that, first of all, the control device of the battery cell is commanded to communicate the corresponding information and hereby to deliver as well the identification or identification number to the respective battery cell in order that the control device of the battery cell responds with the corresponding status information. An individual address of the individual battery cells of the battery can also be the prerequisite for an output of the corresponding information.

The provision of the identification of the respective battery cell accordingly ensures an especially secure and orderly communication between the control device of the battery cell and the external control device.

It has proven further advantageous when the control device of the battery cell has at least one security element, which is arranged in such a way that it is damaged as a result of any mechanical manipulation of the control device. For example, one or a plurality of inputs of the control device can be connected to such a security element, which is also referred to as a trip wire or fuse wire. The severing of such a wire (for instance, during an attempt to open the control device) is detected during operation of the control device by said control device. This can occur immediately during damage to the security element or else during the next startup or boot of the control device.

The control device is preferably designed in this case for the purpose of writing an intrusion sequence or suchlike data set in a memory. If such an intrusion sequence is discovered, then, for example, an access to the memory, in particular to reading and/or writing, is prevented and accordingly no longer executed. Thus, it can be ensured, in particular, that only the original control device can address the respective functional unit.

Security elements, such as, for instance, fuse wires, can be embedded in the package or module of the control device or be carried around the package and/or through the package. Such security elements can be designed as strip conduction lines on a circuit carrier. Beyond this, it is possible to design such security elements as components of an uppermost and a lowermost metal layer of a semiconductor component that belongs to the control device of the battery cell or forms the control device of the battery cell.

When an attempt is made to open the control device or when there is any such manipulation thereof, at least one such security element, in particular, is damaged or completely severed. The control device can thereupon ensure that any access to the at least one functional unit of the battery cell is prevented. In particular, it can be ensured that all data that are stored in a functional unit designed as a memory are erased. By way of such a security element, an especially extensive protection against manipulations at the battery cell is ensured. This safeguards the value of the battery cell. In particular, it can be ensured that a read-out of a memory of the battery cell is no longer possible after severing of a fuse wire. Thus, it is possible, in particular, to ensure an especially great degree of security in regard to the history of the battery cell.

The battery according to the invention comprises a plurality of battery cells according to the invention, which can be connected in series and/or in parallel.

The motor vehicle according to the invention comprises at least one battery according to the invention. The motor vehicle can be designed, for example, as a passenger motor vehicle, in particular as an electric motor vehicle or hybrid motor vehicle. Beyond this, the motor vehicle can also be an electrically driven motorcycle or an electrically driven bicycle.

Furthermore, it is possible to provide the battery in a stationary energy storage system. Beyond this, it can be provided that the battery that is provided in a motor vehicle is further used as a so-called second-life battery, that is, is delivered for utilization in a different way. In particular, in the case of second-life applications, it is namely possible for the requirements placed on, for instance, the efficiency of battery cells to be less stringent than those placed on use of the battery cells for the battery of the motor vehicle.

The method according to the invention serves for the operation of a battery cell for a battery of a motor vehicle, said battery comprising a battery cell housing with a galvanic element accommodated in the battery cell housing. The respective battery cell has two electrical connection terminals, by way of which the battery cell can be connected to at least one other battery cell of the battery in an electrically conductive manner. A control device of the battery cell is operatively connected to at least one functional unit of the battery cell. The control device of the battery cell hereby receives a command issued by an external control device. The control device comprises a checking or verification unit, which verifies an authorization of the external control device to issue the command. By way of such method, a security concept (in particular, a digital security concept) and a data security concept are provided for intelligent battery cells. Furthermore, the method relates to the operation of a battery having a plurality of battery cells.

The advantages and preferred embodiments described for the battery cell according to the invention also apply to the battery according to the invention, to the motor vehicle according to the invention, and to the method according to the invention.

The features and combinations of features described above in the description as well as the features and combinations of features mentioned below in the descriptions of the figures and/or shown in the figures alone can be used not only in the respectively given combination, but also in other combinations, without departing from the scope of the invention. Accordingly, embodiments that are not explicitly shown or discussed in the figures are also to be regarded as included in and disclosed by the invention, although they ensue from separate combinations of features and can be produced from the discussed embodiments.

BRIEF DESCRIPTION OF THE DRAWINGS

Further advantages, features, and details of the invention ensue from the claims, the following description of preferred embodiments, and the drawings. Shown are:

DETAILED DESCRIPTION OF THE DRAWINGS

Figure 1:
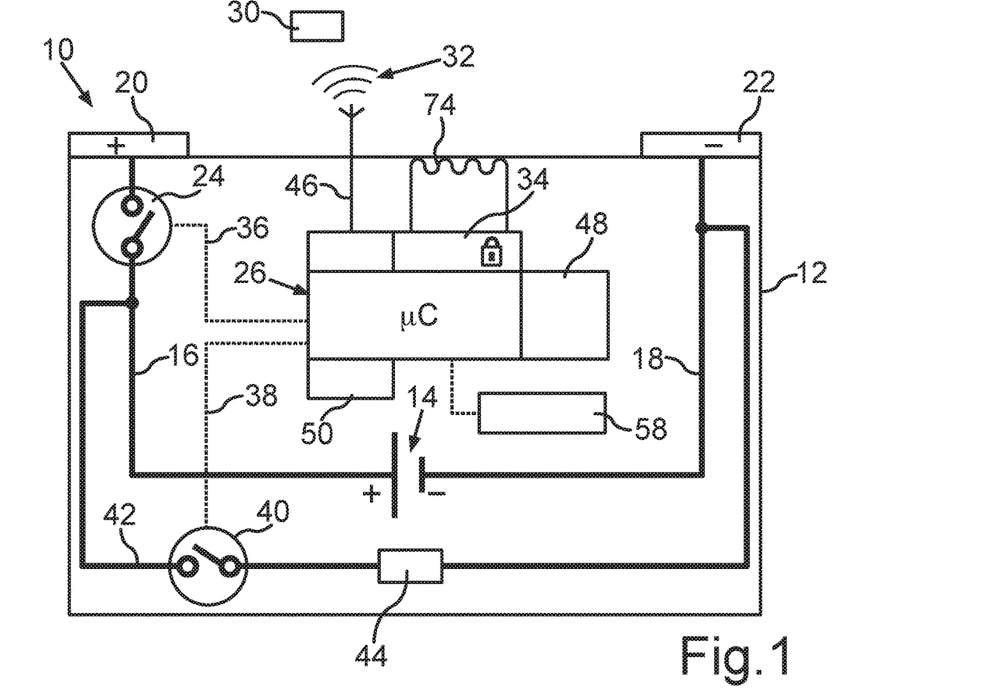
FIG. 1 schematically, a battery cell for a battery of a motor vehicle, which is designed with an overriding control unit for secure communication.

Shown schematically in FIG. 1 is a battery cell 10, such as one that can be employed in a battery 28 (compare FIG. 4) of a motor vehicle. For this purpose, the battery cell 10 can be designed as a lithium ion cell. In the battery 28, which can serve as a traction battery in the motor vehicle, a plurality of such battery cells 10 are usually electrically connected in series and/or in parallel in order to supply appropriately high voltages and currents.

In the case of a series connection of such battery cells 10, it is possible overall for a very high voltage and, namely, a voltage of several hundred volts of the battery 28 to occur, because, for instance, a plurality of battery modules, each of which contains a plurality of battery cells 10, are connected to one another in an electrically conductive manner.

The battery cell 10 comprises a battery cell housing 12, which, in the present case, has a prismatic design by way of example. Arranged inside of the battery cell housing 12 is a galvanic element 14, which comprises arresters 16, 18, coated with a respective electrochemical material. In the present case, for simplicity, the electrodes of the galvanic element 14, comprised by the electrochemically active material and the arresters 16, 18, are illustrated only by the arrester 16 leading to a first electrical connection terminal 20 (for instance, a plus pole) of the battery cell 10 and by the arrester 18 leading to a second electrical connection terminal 22 of the battery cell 10, that is, the arrester 18 leading to the minus pole.

In the case of the battery cell 10 shown in FIG. 1, it is possible to isolate the galvanic element 14 electrically from at least one of the terminals 20, 22. Provided for this purpose is a switching element 24, by means of which an electrically conductive connection between the arrester 16 and the terminal 20 can be interrupted by opening the switching element 24. By closing the switching element 24, it is possible to reestablish the electrically conductive connection between the arrester 16 and the terminal 20.

In an analogous way, it is possible to provide a second switching element (not illustrated), by means of which the electrically conductive connection between the arrester 18 and the terminal 22 can be interrupted or made. The switching element 24, which, in particular, can be designed as a semiconductor component, is switched, for example, by a control device of the battery 10 designed as a microcontroller 26. In the present case, the microcontroller 26, just like the switching element 24, is arranged inside of the battery cell housing 12.

A command 32 can be transmitted to the microcontroller 26 from an external control device, for instance from an overriding control unit 30, to close or to open the switching element 24. The overriding control unit 30 may also be referred to as a so-called smart cell controller. In the present case, it is ensured that not just any external control device can prompt the microcontroller 26 to execute the command 32. The battery cell 10 comprises, namely, a verification unit 34, by means of which it can be verified whether the external control unit 30 has an authorization to issue the command 32. Only when this is the case does the microcontroller 26 actually execute the command 32 and close, for example, the initially opened switching element 24. In the case of an open switching element 24, no electric voltage is present at the electrical connection terminals 20, 22 of the battery cell 10. Only after the closing of the switching element 24 is the battery cell 10 accordingly activated, so that the voltage of the galvanic element 14 is applied at the electrical connection terminals 20, 22.

The microcontroller 26 can apply a control voltage to the switching element 24 via an actuating conduction line 36 and to do so in such a way that, in particular, the opening or closing of the switching element 24 is brought about. In the present case, the microcontroller 26 is not only operatively connected to the switching element 24, but also to further such functional units of the battery cell 10.

For example, the microcontroller 26 is operatively connected via a further actuating conduction line 38 to a further switching element 40. This further switching element 40 is arranged in a conduction line 42, which connects the two arresters 16, 18 to each other. Located in the conduction line 42 is also a resistor element 44. If the microcontroller 26 actuates the switching element 40, then a discharging, in particular a complete discharging, of the galvanic element 14 can thus be brought about. As a result of the complete discharging, the battery cell 10 can be rendered unusable. It can then be transported safely and, for example, delivered to disposal or for recycling. Even when the external control unit 30 issues the command 32 to the microcontroller 26 to close the further switching element 40, the authorization of the external control unit 30 to issue the command 32 is verified in the present case by means of the verification unit 34. For this purpose, it is possible, for example, for the command 32 to be encrypted and the verification unit 34 is designed for the purpose of decrypting the command 32.

For the communication of the microcontroller 26 with the external control unit 30, it is possible to provide a communication unit, which, in the present case, is shown, in schematic design, as a radio antenna 46 and is thus suitable for wireless communication with the control unit 30. Additionally or alternatively, however, it is also possible to provide a wired communication.

For encryption of the entire communication or of parts of the communication, various encryption methods can be employed by the control unit 30 with respect to the microcontroller 26 and/or by the microcontroller 26 with respect to the control unit 30. Thus, it is possible, for example, to employ a symmetric encryption in accordance with AES-128. Additionally or alternatively, asymmetric encryption methods in accordance with PGP (pretty good privacy) can be employed. For this purpose, private and public keys can be stored in the battery cell 10, for example in a memory 48. The memory 48 can be connected to the microcontroller 26. Additionally or alternatively, it is possible to provide a memory 50, which is integrated in the microcontroller 26 or a suchlike computing device.

Figure 2:
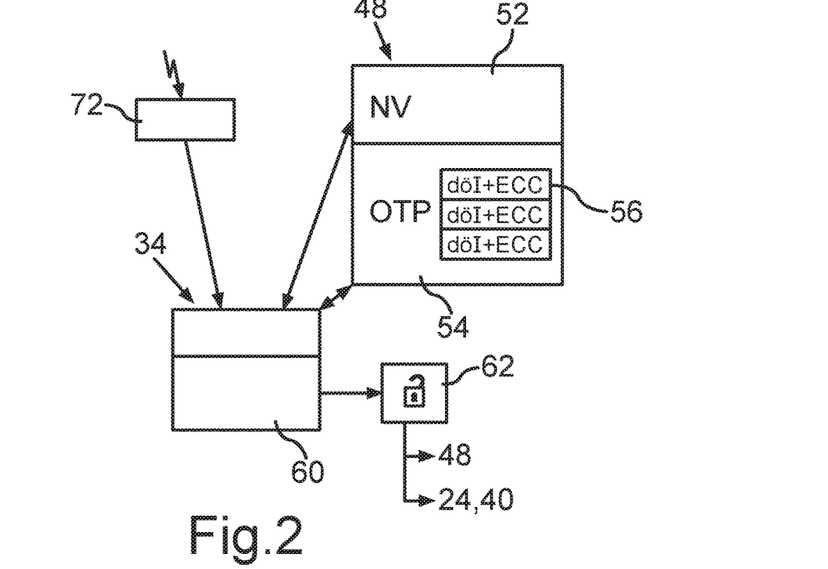
FIG. 2 schematically, a component of the battery cell in accordance with FIG. 1, FIG. 3 the overriding control unit, which is designed for communication with a plurality of battery cells in accordance with FIG. 1 and which is unlocked.

In the present case, the memory 48 comprises a nonvolatile memory 52 and a one-time programmable memory, that is, an OTP memory 54 (compare FIG. 2).

When a communication that is encrypted by means of private and public keys is provided, the respective key can be stored, for example at least in triplicate, in the respective memory 52, 54. The key can hereby be saved in particular together with an error correction code (ECC). The error correction code is preferably designed for the purpose of identifying at least two bit flips or bit errors and for correcting a bit flip or bit error.

The private keys are located preferably in the OTP memory 54 and the public key(s) both in the OTP memory 54 and in the nonvolatile memory 52. The public key can then be read out by the external control unit 30 when the latter is authorized for communication with the microcontroller 26.

In particular, the private keys make possible an encrypted communication for actuation or read-out of the functional units of the battery cell 10, for instance when the switching elements 24, 40 are actuated. However, it is also possible to secure the access to the memory 48 by means of a key, in particular a private key. Namely, the memory 48 itself can also be a functional unit of the battery cell 10 to which the microcontroller 26 is operatively connected. An access by the external control unit 30 to the memory 48 does not then occur directly, however, but rather via the microcontroller 26. Accordingly, it is possible by means of the verification unit 34 to establish first of all whether such an access is to be permitted at all.

In the memory 48, it is possible to store as identification for the respective battery cell 10, for example, a digital public identification number 56 (compare FIG. 2), by means of which the respective battery cell 10 can be unequivocally identified. Such a public identification number 56 can, in particular, be stored in triplicate in the memory 48 and to be done so preferably together with an error correction code (ECC). This error correction code is preferably designed for the purpose of identifying at least two bit flips and correcting a bit flip. In the present case, the identification number 56 is stored in triplicate in the OTP memory 54 and preferably as a copy also in the nonvolatile or nonvolatile memory 52.

The triplicate provision of, for instance, the identification number 56 and/or the key provides for an especially great degree of security. For example, it can namely be provided that all three identification numbers 56 have to be read out in order that, when the three identification numbers 56 are in agreement, a conclusion can be drawn as to their correctness. It is also possible to provide for a stacked read-out of the three identification numbers 56, in which the second identification number 56 is resorted to only when an error detection has been made during read-out of the first identification number 56 and the existence of an error has been determined to be probable.

When the verification unit 34 has established the authorization of the external control unit 30 for output of commands 32, the identification number 56 can be read out. It is then possible, together with the identification number 56, to give, for example, the state of the switching element 24, 40 and the voltage of the battery cell 10 as well as values that indicate a current flow into the battery cell 10 or out of the battery cell 10 and to communicate the like to the external control unit 30.

Furthermore, in the present case, the microcontroller 26 is operatively connected to sensor devices 58, which are capable of recording the parameters relating to the battery cell 10. For example, it is possible by means of the sensor devices 58 to record a temperature and a pressure in the interior of the battery cell housings 12, the nature of the electrolytes of the galvanic element 14, accelerations, and/or mechanical stresses or forces to which the battery cell 10 is exposed. Parameters that can be recorded by means of the sensor devices 58 are stored in the memory 48 in the present case. It can be provided that some of the corresponding information can be read out by the external control unit 30 once the latter identifies the identification number 56 of the battery cell 10. For example, such parameters can comprise the voltage, the temperature of the battery cell 10, and the pressure of the battery cell 10. It can be provided, however, that certain data that are stored in the memory 48 can be made publicly accessible without further ado. Thus, it can be provided that the microcontroller 26 stores the data recorded by means of the sensor devices 58 in encrypted form in the memory 48 and permits only the read-out of such data by means of the external control unit that is authorized to do so.

Furthermore, it can be provided that, for example, in the OTP memory 54 of the microcontroller 26, a key is stored in particular in triplicate and preferably together with an error correction code that serves for encryption of the data to be written into the volatile memory 52 and is also used when these data are read out. As a result of this, it is ensured that an access to the memory 48 is possible only via the local microcontroller 26. Thus, even when the control unit 30 is authorized for communication with the microcontroller 26 and is virtually unlocked, the actual access to the memory 48 occurs and accordingly does so to the data that is encrypted and is to be decrypted by the microcontroller 26 via this local computing device.

It is also possible to provide different, particularly private keys for the different functions. A stacked security can also be provided, in which an access to a next higher level is possible only after unlocking of the next lower level. Via such multistep secured functions, it is possible to provide different privacy levels, for instance for the storing of data, for the reading of data, or for the overwriting of data in the memory 48. The operation of the switching elements 24, 40 or like isolating switches can also be made dependent on prior unlocking of a hierarchically overriding level.

When the authorization of the external control unit 30 for output of commands 32 to the microcontroller 26 is verified, it can be provided that the command sequence comprises an identification number or suchlike identification of the external control unit 30 and the identification number 56 of the responding battery cell 10. Furthermore, the command sequence can comprise the command provided for actuation of the switching element 24, 40. Beyond this, it can be provided that the command 32 for actuation of the switching elements 24, 40 comprises a time stamp and/or an energy value of the battery cell 10. Such a time stamp or energy value can, in addition, be encrypted. Furthermore, it can be provided that the command sequence includes an error correction code.

When, for actuation of the switching element 24, 40 or of a suchlike isolating switch, the time stamp and/or the energy value of the battery cell 10 are or is included in the command 32, it can thereby be ensured that an eavesdropping of the corresponding communication and a later illicit utilization of the copied command do not function. The energy value of the battery cell 10 can indicate the amount of energy that has hitherto been introduced into the battery cell 10 and delivered by the battery cell 10.

In particular, the closing of the switching element 24 is a reasonable operation, because, as a result thereof, the battery cell 10 or even the entire battery 28 is activated, so that a voltage can be applied to the terminals 20, 22 of the battery cell 10 or to the high-voltage terminals of the battery 28. It can therefore be provided that, after the output of the command 32 that prompts the microcontroller 26 to close the switching element 24, after elapse of a predetermined period of time, and/or after a specific energy flow into the battery cell 10 or out of the battery cell 10, a new command 32 has to be issued in order that the switching element 24 also remains closed.

For this purpose, the verification unit 34 can comprise a component 60 (compare FIG. 2), which verifies the renewal of the command 32, that is, the issue of a so-called keep-alive command. The provision of the component 60 for verifying the keep-alive command ensures that the battery cells 10 are automatically switched off when, over an appropriately long time, no communication of the external control unit 30 with the battery cells 10 has occurred. When, for example, after a specific number of hours and/or watt seconds, no keep-alive command is therefore recorded by the component 60, the response function of the microcontroller 26 for closing the switching element 24 has to be unlocked again.

Figure 4:
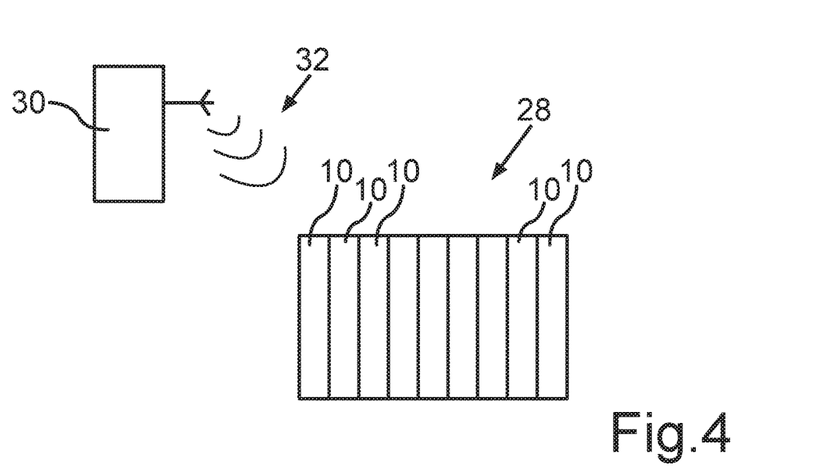
FIG. 4 the overriding control unit, which communicates with the battery cells of the battery.

The keep-alive command can comprise, for example, the identification numbers 56 of all battery cells 10 of the battery 28 (compare FIG. 4). In this way, it can be ensured that, when one of the battery cells 10 is replaced or in the event of such a manipulation after elapse of the provided period of time or after a predetermined value of the energy flow has been attained, no further operation of the battery 28 is possible. In this way, it is possible largely to prevent any manipulations at the battery 28.

In FIG. 2, it is illustrated that, only after a release 62, for example, is access permitted to the data stored in the memory 48 or may the switching elements 24, 40 be operated.

Figure 3:
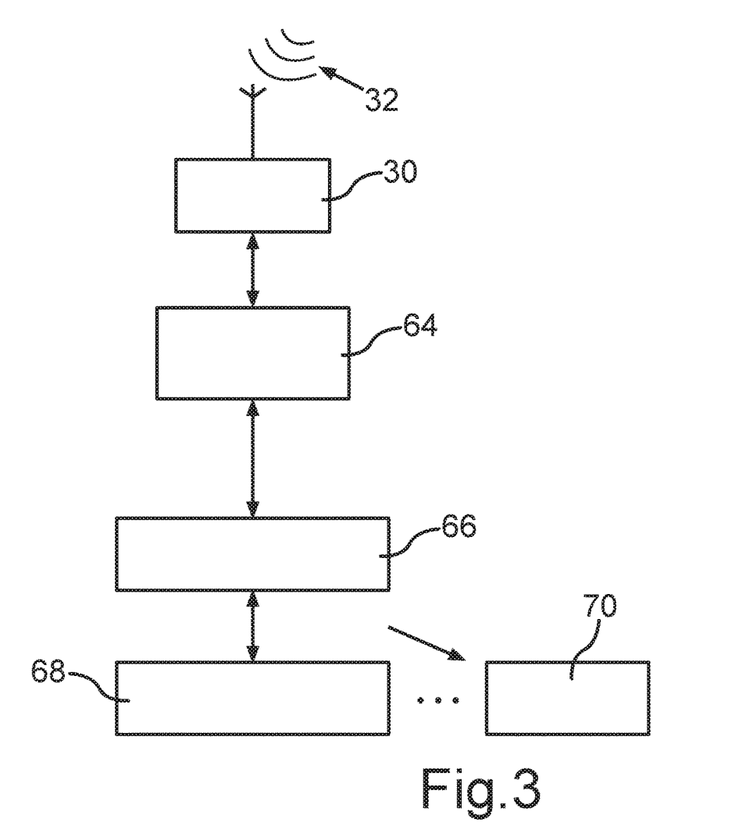

A possibility for unlocking the external control unit 30 is illustrated on the basis of FIG. 3. Namely, it can be provided that the external control unit 30 has to communicate beforehand with further control units of the motor vehicle in order to be authorized to issue the command 32. Accordingly, a communication of the external control unit 30 with a battery management system 64 and, additionally or alternatively, with a battery fuse box 66, a power electronics unit 68, and/or a charging unit 70 can be provided in order to unlock the external control unit 30. Located in the battery fuse box 66, which is also referred to as a battery junction box (BJB), are the high-volt protectors of the battery 28. It can be provided that only after an exchange of the corresponding identifications of these control units or components is the external control unit 30 unlocked for communication with the battery cell 10.

For this purpose, it is possible to store an identification number of the external control unit 30 in, for example, the nonvolatile memory 52 of the battery cell 10, said identification number comprising a number of the battery fuse box 66 and/or of the charging unit 70. If the control unit 30 then reports itself with this identification number, then the verification unit 34 of the battery cell 10 can determine that the external control unit 30 communicating with the battery cell 10 is that belonging to the same motor vehicle as at least one further component shown in FIG. 3. After this unlocking of the external control units 30, it is then possible for the commands 32 for the operation the switching elements 24, 40 and for the access to the memory 48, in particular, to be issued by the external control unit 30 to the battery cell 10.

Once the function of operating the isolating switches or switching elements 24, 40 has been unlocked in this general way, the respective commands 32 for the operation of the switching elements 24, 40 can be employed. Keys of these commands 32 can be stored in the OTP memory 54 in triplicate, for example, together with a respective error correction code and, after the unlocking of the external control unit 30, can be read out by the external control unit 30. These commands 32 can comprise the closing and opening of the switching element 24 and the keep-alive command for keeping closed the switching element 24. Beyond this, the discharging and, in particular, the complete discharging of the battery cell 10 can be brought about by closing of the switching element 40 by means of the command 32 issued by the unlocked control unit 30.

When the microcontroller 26 stores the data encrypted in the memory 48, the actual memory access occurs, even after the unlocking of the external control unit 30, solely via the microcontroller 26. In the event of any destruction of or damage to the microcontroller 26, access to the memory 48 is then no longer possible. In particular, it is no longer possible to read out data stored in the nonvolatile memory 52.

Furthermore, it can be provided that, regardless of the identification number 56 of the battery cell 10, a emergency message or a suchlike special command 72 can bring about opening of the switching element 24 (compare FIG. 2). Such a special command 72 can be employed, for example, in the case when, after an accident of a motor vehicle having the battery 28, the battery 28 is to be switched in a volt-free manner. A corresponding emergency message can be, for example, at least 1,024 bits long. Additionally or alternatively, a special command 72 can bring about the complete discharging of the battery cell 10 by closing the switching element 40.

As can be seen from FIG. 1, the microcontroller 26 or a chip comprising the microcontroller 26 can have a security element 74 in the form of, for instance, so-called fuse wires or the like. Such fuse wires, which are also referred to as trip wires, are severed in the present case when someone attempts to open the microcontroller 26 in order to gain access to its secrets. The microcontroller 26 detects this in operation either immediately or after the next startup. Subsequently, the microcontroller 26 can program an intrusion sequence in the nonvolatile memory 52 and/or in the OTP memory 54. If the microcontroller 26 then finds such a intrusion sequence prior to the execution of an access to the memory 48, then any further memory access, that is, in particular, a reading and/or writing, is prevented. It can also be provided for that all data that is stored in the memory 48 of the battery cell 10 are erased.

By way of the above-described, in particular multistep digital security concept, a series of advantageous functions are realized. In particular, the history of the battery cell 10 can be stored securely encrypted in the memory 48 and nonetheless the life of the battery cell 10, for instance in regard to values of the current, the voltage, the temperature, and the like, is documented preferably without any gaps. Beyond this, a secured access to the different levels is ensured. For example, a functional entity or else a verification entity that services the battery 28 or the individual battery cells 10 receives only the necessary access. In particular, only an authorized external computing device in the form of, for instance, the external control unit 30 actuates the switching elements 24, 40.

In regard to a recording or storage of the data in the memory 48, it can be provided that this occurs on command 32. However, it can also be provided that such a storage of the data fundamentally occurs constantly, with it being possible, however, to establish by means of the command 32 that, over a specific period of time, no data are stored in the memory 48 or to establish the way in which data are to be stored there. Switching on a constant logging or recording of the data can, for example, be achieved via corresponding memory locations in the OTP memory 54.

Furthermore, it can be provided that certain functions are activated or deactivated one time. It is also possible for this purpose to provide for corresponding memory locations in the OTP memory 54, in particular. This makes it possible, for example, to adapt the operation of the microcontroller 26 to a respective type of battery cell 10. For example, certain analyses and routines, which are not needed for a specific type of battery cell 10, are switched off in order to save energy, for instance.

Furthermore, in the present case, a deactivation of the battery cell 10 occurs when the battery cell 10 is opened for access to the microcontroller 26 or when it is destroyed. By preferably unlocking first of all the external control unit 30, a so-called distributed secret is realized and offers security against undesired tuning as well as theft protection. The actuation of the switching elements 24, 40, which, in particular, can be designed as power transistors, is activated in the present case only after the transmission of secret information is activated and is namely done so preferably for a specific period of time. The repeated transmission of keep-alive commands to the microcontroller 26 then ensures the continuously controlled function or the keep-alive state of the battery cell 10.

By making it possible for or permitting the external control unit 30 of the motor vehicle to address only known or previously instructed battery cells 10, furthermore, a protection of original parts is ensured. As a result of this, the use of incorrect and/or unsuitable and/or stolen battery cells 10 is prevented. A protection against vandalism is also ensured in that, for instance an external opening of the battery cell 10 can be detected on the basis of damage to the security element 74.

Furthermore, any attempt at memory access by a microcontroller 26 that does not correspond to the original is detected, because the microcontroller 26 is capable of storing an intrusion sequence in the memory 48. When vandalism is identified, it is possible, for example, to ensure by means of such an intrusion sequence that the data stored in the memory 48 is rendered unusable or that the access is prevented.

The microcontroller 26 can also save the identification number of the external control unit 30 in the memory 48. It is then possible to trace unequivocally the motor vehicle in which the battery cell 10 was employed and how the respective history of the battery cells 10 is manifested in this motor vehicle.

It is also possible for the external control unit 30 to save the identification numbers 56 of all battery cells 10, so that, in cross comparison, the life history of all battery cells 10 can be clearly traced. This safeguards the value of the battery cells 10, in particular, for a later use in the scope of alternative applications, that is, in so-called second-life applications.

It can also be provided that, through an intentional active destruction of the security element 74 (for instance, by applying an appropriate current to the fuse wires) or through a command sequence, an active discharging of the battery cell 10 is initiated. The active discharging can be accomplished by closing the switching element 40. At the same time, a later closing of the switching element 24 can be rendered impossible.

The invention claimed is:

1. A battery cell for a battery of a motor vehicle, comprising:
 a battery cell housing, in which a galvanic element is accommodated, with two electrical connection terminals, by way of which the battery cell is electrically connected to at least one other battery cell of the battery, and with a control device, which is operatively connected to at least one functional unit of the battery cell,
 wherein the control device of the battery cell programmed to receive an encrypted command issued by an external control device, wherein the control device includes a checking or verification unit, which is programmed to decrypt the encrypted command and verify an authorization of the external control device to issue the command via an access control, an authorization of the access control is a prerequisite for the execution of the encrypted command, wherein the battery cell further comprises at least one key for the encryption of information to be transmitted by the external control device and data to be stored in a memory of the battery cell and for decrypting commands issued by the external control device, wherein the access control is executed by the verification unit, in which the prior execution of a first command, hierarchically overriding command, is a prerequisite for the execution of a second command, hierarchically subordinate command so that a multistep security is provided, in which an access to a next level is enabled after unlocking of a previous level, wherein for each step of the multistep security, different key for the encryption is provided, and wherein the at least one other battery cell includes a second control device, and the external control device issues the command to the control device of the battery cell and the second control device of the at least one other battery cell.

2. The battery cell according to claim 1, wherein the at least one functional unit of the battery cell includes a switching element, with which the control device is programmed to make and break an electrically conductive connection between an arrester of the galvanic element and at least one of the electrical connection terminals, wherein the control device of the battery cell is further programmed to alter a switching state of the switching element on command.

3. The battery cell according to claim 1, wherein the at least one functional unit of the battery cell includes a switching element, which is arranged in a conduction line, which connects the arresters of the galvanic element to each other, wherein a resistor element is arranged in the conduction line, and wherein the control device of the battery cell is programmed to close the switching element on command.

4. The battery cell according to claim 3, wherein the control device of the battery cell is programmed to open a switching element, arranged between the arresters and the at least one electrical connection terminal and programmed to close the switching element arranged in the conduction line when at least one predetermined special command is received.

5. The battery cell according to claim 1, wherein the at least one functional unit of the battery cell includes a memory for storing data values that give parameters programmed to be recorded by at least one sensor device of the battery cell, wherein the control device of the battery cell is programmed to access the memory on command.

6. The battery cell according to claim 1, further comprising:
an identification read out by the external control device.

7. The battery cell according to claim 1, wherein the control device of the battery cell has at least one security element, which is arranged in such a way that it is damaged as a result of any mechanical manipulation of the control device.

* * * * *